United States Patent
Xu et al.

(10) Patent No.: US 11,742,029 B2
(45) Date of Patent: Aug. 29, 2023

(54) ADJUSTING READ-LEVEL THRESHOLDS BASED ON WRITE-TO-WRITE DELAY

(71) Applicant: MICRON TECHNOLOGY, INC., Boise, ID (US)

(72) Inventors: Zhongguang Xu, San Jose, CA (US); Tingjun Xie, Milpitas, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 90 days.

(21) Appl. No.: 17/402,279

(22) Filed: Aug. 13, 2021

(65) Prior Publication Data
US 2023/0050305 A1 Feb. 16, 2023

(51) Int. Cl.
| | | |
|---|---|---|
| *G11C 16/30* | (2006.01) | |
| *G11C 16/26* | (2006.01) | |
| *G11C 16/10* | (2006.01) | |
| *G11C 16/34* | (2006.01) | |
| *G11C 16/32* | (2006.01) | |

(52) U.S. Cl.
CPC .......... *G11C 16/26* (2013.01); *G11C 16/102* (2013.01); *G11C 16/30* (2013.01); *G11C 16/32* (2013.01); *G11C 16/3404* (2013.01)

(58) Field of Classification Search
CPC ....... G11C 16/26; G11C 16/102; G11C 16/30; G11C 16/32; G11C 16/3404
See application file for complete search history.

(56) References Cited

U.S. PATENT DOCUMENTS

| | | | |
|---|---|---|---|
| 10,790,036 B1 * | 9/2020 | Zhou | G11C 13/0038 |
| 2020/0185046 A1 * | 6/2020 | Li | G11C 16/0408 |

* cited by examiner

*Primary Examiner* — Xiaochun L Chen
(74) *Attorney, Agent, or Firm* — Lowenstein Sandler LLP

(57) ABSTRACT

A method includes performing a first write operation that writes data to a first memory unit of a group of memory units in a memory device, determining a write-to-write (W2W) delay based on a time difference between the first write operation and a second write operation on a memory unit in the group of memory units, wherein the second write operation occurred prior to the first write operation, identifying a threshold time criterion that is satisfied by the W2W delay, identifying a first read voltage level associated with the threshold time criterion, and associating the first read voltage level with a second memory unit of the group of memory units. The second memory unit can be associated with a second read voltage level that satisfies a selection criterion based on a comparison of the second read voltage level to the first read voltage level.

20 Claims, 9 Drawing Sheets

400

---

Perform a write operation that writes data to a first memory unit of a group of memory units
402

↓

Determine a write-to-write (W2W) delay based on a time difference between the first write operation and a second write operation on a memory unit in the group of memory units, such that the second write operation occurred prior to the first write operation
404

↓

Identify a threshold time criterion that is satisfied by the W2W delay
406

↓

Identify a first read voltage level associated with the threshold time criterion
408

↓

Identify a second memory unit of the group of memory units, wherein the second memory unit is associated with a second read voltage level that satisfies a selection criterion, and wherein the selection criterion is based on a comparison of the second read voltage level to the first read voltage level
410

↓

Associate the first read voltage level with the second memory unit
412

```
Receive a request to read from a memory unit
452
```
↓
```
Responsive to the request to read from the memory unit, identify a
read voltage level associated with the memory unit
454
```
↓
```
Read data from the memory unit in accordance with the read voltage
level
456
```

```
Receive a request to read from a memory unit
462
```
↓
```
Responsive to the request to read from the memory unit, identify a
read level tag associated with the memory unit
464
```
↓
```
Identify a read voltage level that corresponds to the read level tag
466
```
↓
```
Read data from the memory unit in accordance with the read voltage
level
468
```

| | Threshold Time Criterion 506 | Read Level Tag 508 |
|---|---|---|
| Record 501 | W2W >= 0 seconds and < 1 minute | 0 |
| Record 502 | W2W >= 1 minute and < 60 minutes | 1 |
| Record 503 | W2W >= 60 minutes and < 180 minutes | 2 |
| Record 504 | W2W >= 180 minutes | 3 |

| | Read Level Tag 508 | Read Voltage Level 510 |
|---|---|---|
| Record 511 | 0 | 1 |
| Record 512 | 1 | 2 |
| Record 513 | 2 | 3 |
| Record 514 | 3 | 4 |

| | Threshold Time Criterion 506 | Read Voltage Level 510 |
|---|---|---|
| Record 521 | W2W >= 0 seconds and < 1 minute | 1 |
| Record 522 | W2W >= 1 minute and < 60 minutes | 2 |
| Record 523 | W2W >= 60 minutes and < 180 minutes | 3 |
| Record 524 | W2W >= 180 minutes | 4 |

FIG. 5C

600
T=0 minutes

Write Timestamp=0
W2W delay=0

| Memory Unit Identifiers | Read Voltage Levels/ Tags |
|---|---|
| MU0 | 0 |
| MU1 | 0 |
| MU2 | 0 |
| MU3 | 0 |
| MU4 | 0 |

602
T=2 minutes
Write to MU2
Write Timestamp=0
W2W delay=2 minutes

| Memory Unit Identifiers | Read Voltage Levels/ Tags |
|---|---|
| MU0 | 1 |
| MU1 | 1 |
| MU2 | <u>0</u> |
| MU3 | 1 |
| MU4 | 1 |

604
T=65 minutes
Write to MU1
Write Timestamp=2 minutes
W2W delay=63 minutes

| Memory Unit Identifiers | Read Voltage Levels/ Tags |
|---|---|
| MU0 | 2 |
| MU1 | <u>0</u> |
| MU2 | 2 |
| MU3 | 2 |
| MU4 | 2 |

606
T=68 min
Write to MU2
Write Timestamp=65 min
W2W delay=3 min

| Memory Unit Identifiers | Read Voltage Levels/ Tags |
|---|---|
| MU0 | 2 |
| MU1 | 1 |
| MU2 | <u>0</u> |
| MU3 | 2 |
| MU4 | 2 |

608
T=268 min
Write to MU3
Write Timestamp=68 min
W2W delay=200 min

| Memory Unit Identifiers | Read Voltage Levels/ Tags |
|---|---|
| MU0 | 3 |
| MU1 | 3 |
| MU2 | 3 |
| MU3 | <u>0</u> |
| MU4 | 3 |

610
T=338 min
Write to MU4
Write Timestamp=268 min
W2W delay=70 min

| Memory Unit Identifiers | Read Voltage Levels/ Tags |
|---|---|
| MU0 | 3 |
| MU1 | 3 |
| MU2 | 3 |
| MU3 | 2 |
| MU4 | <u>0</u> |

FIG. 6

ADJUSTING READ-LEVEL THRESHOLDS BASED ON WRITE-TO-WRITE DELAY

TECHNICAL FIELD

Embodiments of the disclosure relate generally to memory sub-systems, and more specifically, relate to adjusting read-level thresholds based on write-to-write delay in memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure. The drawings, however, should not be taken to limit the disclosure to the specific embodiments, but are for explanation and understanding only.

FIG. 4A is a flow diagram of an example method to associate read voltage levels with memory units based on W2W delay in accordance with some embodiments.

FIG. 4C is a flow diagram of an example method to read data from a memory unit using a read voltage level associated with the memory unit in accordance with some embodiments.

FIG. 4D is a flow diagram of an example method to read data from a memory unit using a read level tag associated with the memory unit in accordance with some embodiments.

FIG. 5A illustrates a table that maps threshold time criteria to read level tags in accordance with some embodiments.

FIG. 5B illustrates a table that maps read level tags to read voltage levels in accordance with some embodiments.

FIG. 5C illustrates a table that maps threshold time criteria to read voltage levels in accordance with some embodiments.

FIG. 6 illustrates example read voltage levels generated in response to write operations in accordance with some embodiments.

DETAILED DESCRIPTION

Figure 1:
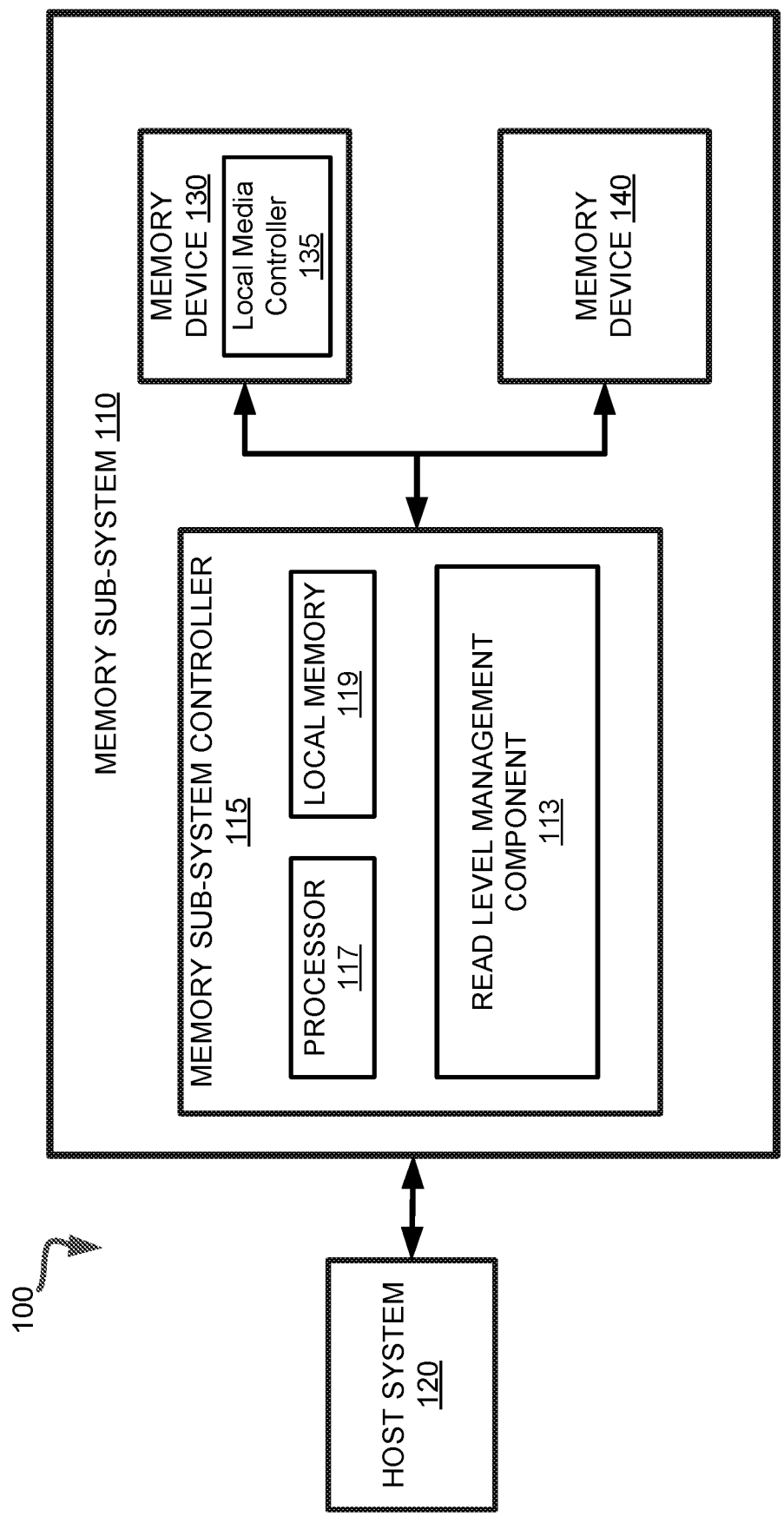
FIG. 1 illustrates an example computing system that includes a memory sub-system in accordance with some embodiments of the present disclosure.

Aspects of the present disclosure are directed to read voltage adjustment for memory units in a memory sub-system based on write-to-write delay. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device that includes an array of non-volatile memory cells. A 3D cross-point memory device can perform bit storage based on a change of bulk resistance, in conjunction with a stackable cross-gridded data access array. Another example is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. A memory device can be called a "drive", which has multiple dies layered in multiple "decks."

A read operation can be performed using a signal (e.g., applied to a wordline of the memory array) having a read voltage level. The read threshold voltage level or value (herein the "read voltage level") can be a particular voltage that is applied to memory cells of a memory device to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

In some memory sub-systems, when the threshold voltage programming distributions of a memory cell change, using the same read voltage level for read operations can result in read errors, thus resulting in retries, which degrades system performance. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at a wrong value as compared to the value as originally stored when the threshold voltage had not yet shifted.

For certain memory types (i.e., for memory sub-systems employing certain types of storage media), error rates can vary over time. In particular, some non-volatile memories have threshold voltage programming distributions that move or "drift" higher over time. At a given read voltage level (i.e., a value of the voltage applied to a memory cell as part of a read operation), if the threshold voltage programming distributions move, then certain reliability statistics can also be affected. One example of a reliability statistic is a bit error rate (BER). The BER can be defined as the ratio of the number of erroneous bits to the number of all data bits stored in a unit of the memory sub-system, where the unit can be the entire memory sub-system, a die of memory device, a collection of codewords, or any other meaningful portion of the memory sub-system.

Some memory sub-systems can mitigate the effects of voltage drift by performing read scrub operations on media cells. The read operations refresh the media cells, thereby reducing the voltage drift of the cells. For example, a memory sub-system can perform read operations that read each cell of the memory system at periodic intervals (e.g., every 3 hours). The read scrub operations push the threshold voltage programming distributions down to mitigate voltage drift. The read scrub operations can be performed as background operations, e.g., operations having lower priority that ordinary read and write operations, and that the memory sub-system can perform when otherwise idle. However, the read scrub can degrade system performance, e.g., by reducing quality of service metrics such as read or write latency. Further, the read scrub can create read disturb, in which the read operations performed on particular cells can cause nearby cells to change over time. Read disturb can cause read errors and data loss. Some memory sub-systems can also manage voltage drift by adjusting the read voltage level for all memory units in a group based on the amount of elapsed time since the previous write to a memory unit in the group. However, such techniques do not take into account the varying ages of different memory units in a group, and generally do not improve performance for heavy workloads or short drift times.

Aspects of the present disclosure address the above and other deficiencies by using a read voltage adjustment technique in which a memory sub-system adjusts read voltage levels based on write-to-write delay. The memory sub-system maintains a read voltage level for each memory unit (e.g., memory page) in a group of memory units. A read voltage level can have values such as 0, 1, 2, 3, and so on, each of which corresponds to a read voltage level that can be used in a read operation on the memory unit that is associated with the read voltage level. Thus, to read data from a memory unit, the memory sub-system can access the read voltage level associated with the memory unit, identify a read voltage level associated with the read voltage level, and perform the read operation in accordance with the identified read voltage level.

Since each read voltage level can consume a relatively small amount of memory, e.g., 1 or 2 bits, and the memory sub-system can efficiently store and update thousands of read voltage levels corresponding to thousands of memory pages. Read voltage level 0 can represent the lowest read voltage and can be an initial read level that is used for memory units that have recently been written or do not contain valid data. Read voltage level 1 can represent a higher read voltage that is used for older memory units that were written more than a threshold amount of time in the past (e.g., having a write-to-write delay greater than the threshold amount). Read voltage level 2 can represent a still higher read voltage used for still older memory units, and so on. Successively-numbered read levels can represent successively higher read voltages corresponding to successively older ages.

As time passes and write operations are performed on individual memory units, the memory sub-system can update the read voltage level of each memory unit to reflect the amount of time that has passed since a write operation was performed on the memory unit. The memory sub-system can update the read voltage levels associated with the memory units in accordance with a threshold age criterion, such as a threshold time value or range. The memory sub-system can update the read voltage levels in response to write operations, for example. Each read voltage level can be updated by the memory sub-system in response to the threshold age criterion being satisfied by a write-to-write (W2W) delay of a write operation performed on any memory unit in the group of memory units. The read voltage level associated with a memory unit can be changed to a higher read voltage level (e.g., corresponding to a higher read voltage value, such as 0.3 volts) if a threshold age criterion associated with the higher read voltage level is satisfied, or reset to the lowest read voltage level in response to a write operation being performed on the memory unit associated with the read voltage level.

Advantages of the present disclosure include, but are not limited to, improved performance resulting from improved data integrity. Since read voltage levels are adjusted to counteract voltage drift, the read error rate and read retry rates are reduced. Storing a read voltage level for each memory unit increases performance for heavy workloads and for drift times ranging from short to long drift times, since the read voltage level for each memory unit can be determined according to a per-memory-unit time since the particular memory unit was written to. Since the read voltage level is small (e.g., one or two bits), storing the per-memory-unit read level can be more efficient than alternatives such as storing a timestamp or read voltage level for each memory unit. Further, the adjustment of read voltage levels can reduce or eliminate the need for read refresh operations, thereby reducing read disturb effects.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory component can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read level management component 113 that can be used to adjust read voltage levels that represent read voltage levels for memory units, and to read data from the memory units using read voltages determined from the read voltage levels. The read voltage level identifies a read voltage level to use when reading cells of the associated memory unit. read voltage levels can have values such as 0, 1, 2, 3, and so on, each of which represents a read level and corresponds to a read voltage. As time passes and write operations are performed on individual memory units, the memory sub-system updates the read voltage level associated with each memory unit to reflect the amount of temporal voltage shift, so that read operations use read levels that are adjusted to compensate for the voltage shift. Further details relating to the operations of the read voltage adjustment component 113 are described below.

Figure 2:
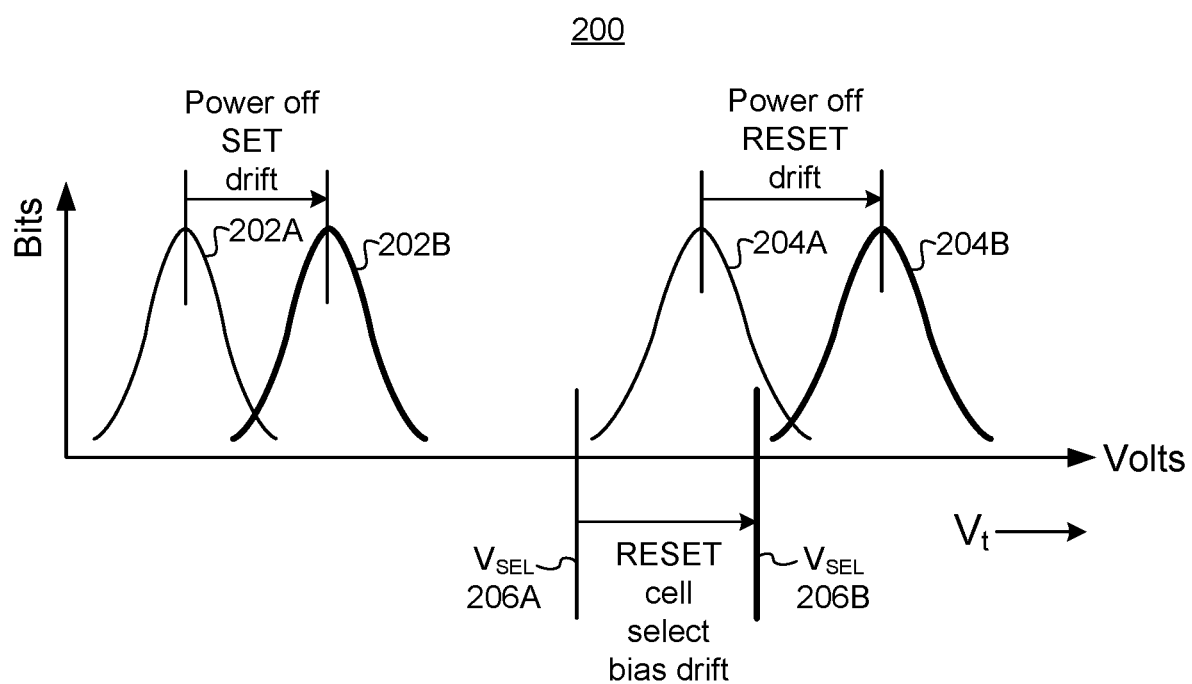
FIG. 2 illustrates example temporal voltage shift in a memory device in accordance with some embodiments.

FIG. 2 illustrates example temporal voltage shift in a memory device in accordance with some embodiments. Shown on a graph 200 are a SET voltage distribution 202A, which corresponds to a programmed value of, e.g., 0, and a RESET voltage distribution 204A, which corresponds to a programmed value of, e.g., 1. The horizontal (Volts) axis represents voltage values, which increase toward the right. The initial SET distribution 202A has drifted to a shifted SET distribution 202B during a time period. The memory device 130 can be in a powered off state for at least a portion of the time period. The amount of voltage shift between SET distributions 202A, 202B is labeled "Power off SET drift." Similarly, the initial RESET distribution 204A has drifted to a shifted RESET distribution 204B during the same time period. The amount of voltage shift between RESET distributions 204A, 204B is labeled "Power off RESET drift." A threshold read voltage level (not shown) that demarcates the shifted SET distribution 202B and the shifted RESET distribution 204B has also shifted. Reading data using read voltage levels that are not adjusted to compensate for temporal voltage shift is likely to result in read errors because of the difference between the applied read voltage and the shifted threshold voltages. An initial RESET cell select bias VSEL 206A has also drifted to a shifted RESET cell select bias VSEL 206B, as indicated by the label "RESET cell select bias drift." Since the RESET cell select bias has drifted to a higher voltage VSEL 206B, the amount of voltage needed to select the RESET cell to write data has also increased.

Figure 3:
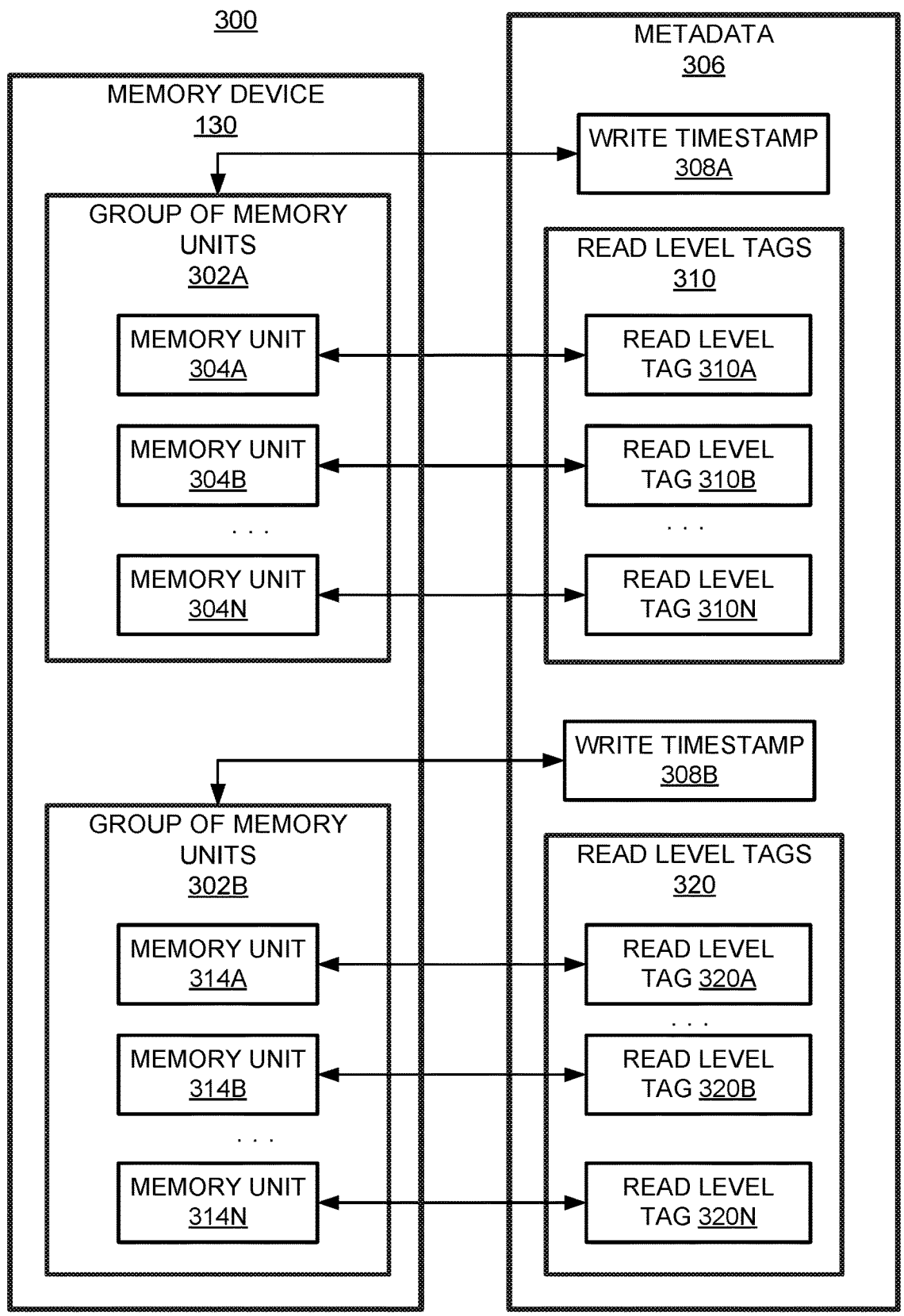
FIG. 3 illustrates example groups of memory units and associated metadata, including write timestamps and read level tags, in accordance with some embodiments.

FIG. 3 illustrates example groups 302 of memory units 304, 314 and associated metadata 306, including write timestamps 308 and read level tags 320, in accordance with some embodiments. As shown in FIG. 3, a memory sub-system 300 includes a memory device 130 and metadata 306. The memory sub-system 300 corresponds to the memory sub-system 110 of FIG. 1. The metadata 306 can be stored on the memory device 130 or other storage media (not shown). The metadata 306 can be generated and updated by a read level management component 113 of the memory sub-system 300, for example. Although the description regarding the example metadata of FIG. 6 refers to read level tags stored in the metadata, the description also applies to storing read level voltages in the metadata instead of or in addition to read level tags.

The memory device 130 can include cells that are arranged in memory units 304, 314. A memory unit can be a collection of codewords, such as a page, or any other meaningful portion of the memory sub-system. The memory units 304, 314 can be arranged in groups 302. In the example of FIG. 3, a first group 302A of memory units 304 includes memory units 304A and 304B through 304N. Further, a second group 302B of memory units 314 includes memory units 314A and 314B through 314N. Each group of memory units 302 is associated with a write timestamp 308 stored in the metadata 306. More particularly, the first group 302A of memory units is associated with a first write timestamp 308A, and the second group 302B of memory units is associated with a second write timestamp 308B. Each write timestamp 308 can specify a time at which data was written to a memory unit 304 in the associated group 302. Data write operations can program memory cells, e.g., by writing the data stored in a memory unit 304 to different memory cells. Thus, data write operations have the effect of resetting the voltage thresholds of the memory cells to initial (e.g., pre-shift) values. The write timestamp 308 indicates a time at which the voltage shift of a memory unit 304 of the group 302 began, so the time difference between a current time and the write timestamp represents an amount of time for which voltage shift has been occurring. Thus, the time difference is related to the amount by which a threshold voltage, such as a read voltage level, has shifted.

The metadata 306 associates a set of read level tags with each group of memory units 302. Each read level tag 310A, 310B, 310N in a set of read level tags 310 is associated with a respective memory unit 304A, 304B, 304N in a first group of memory units 302A. 304. Each read level tag can correspond to a read voltage level. For example, read level tag 310B can have the value "0" to indicate that the read voltage level for the associated memory unit 304A is a particular value, such as 0.1 volts. Read level tag 310B can have the value "1" to indicate that the read voltage level for the associated memory unit 304B is a different particular value, such as 0.2 volts. Read level tags 310 can be reset to an initial value that corresponds to an initial (e.g., lowest) read voltage level in response to a write operation being performed on the associated memory unit 304. For example, if read level tag "0" corresponds to the initial read voltage level, then the read level management component 113 can set the read level tag 310A associated with memory unit 304A in response to a write operation being performed on memory unit 304A. Further, the write timestamp 308A associated with the first group 302A can be updated to reflect a time at which the write operation on memory unit 304A is performed.

A memory device 130 can include a second group 302B of memory units 314. The group 302B is associated with a second write timestamp 308B, which can specify a time at which data was written to a memory unit 314 in the associated group 302. Each read level tag 320A, 320B, 320N in a set of read level tags 320 is associated with a respective memory unit 314A, 314B, 314N in a second group of memory units 302B FIG. 4A is a flow diagram of an example method 400 to associate read voltage levels with memory units based on W2W delay in accordance with some embodiments. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the read level management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The read level management component 113 can maintain a data structure that maps memory units to corresponding read voltage levels. Each read voltage level can be a numeric value represented using a small number of bits, e.g., 1, 2, or 3 bits. For example, a 1-bit read voltage level can be one of two read voltage levels (levels 1 and 2). A 2-bit read voltage level can be one of four read voltage levels (levels 1, 2, 4, and 4). A read voltage level that is represented using a small number of bits (e.g., fewer bits than a numeric value such as an integer or floating-point value) can also be referred to herein as a "read level tag." The read voltage level can alternatively be a voltage value, e.g., 0.2 volts or other value for use in read operations. In some embodiments, a read level tag can be represented using fewer bits than a read voltage level, and a read level tag can be associated with each memory unit. Each read level tag can be mapped to a corresponding read voltage level by a mapping data structure, in which case each read voltage level can be a numeric level identifier (e.g., level 1, level 2, and so on), or a voltage value (e.g., 0.2 volts, or other value). The numeric level identifiers can be mapped to voltage values by a mapping table. In other embodiments, a read voltage level that is a numeric level identifier can be associated with each memory unit, and a mapping table can be used to map the numeric level identifiers to voltage values to perform read operations.

The read level management component 113 can initially set a read voltage level of each memory unit to an initial read voltage level that is to be used in write operations for which a write-to-write time is less than a threshold amount of time. The initial read level can be used when reading from memory units that have recently been written, for example. The initial read voltage level can be a base read level of a memory device. "Base read level" herein shall refer to the initial threshold voltage level exhibited by the memory cell immediately after programming. In some implementations, base read levels can be stored in the metadata of the memory device 130.

At operation 402, the processing device performs a write operation that writes data to a first memory unit 304A of a group of memory units. The first memory unit 304A can be in a group 302A of memory units that also includes one or more second memory units 304B. The processing device can receive the request from a host system 120, for example. The request can specify the data and a memory location (e.g., address) in the memory unit 304A at which the data is to be stored by a write operation. The write operation can store the specified data in one or more memory cells of the first memory unit 304A.

At operation 404, the processing device determines a write-to-write (W2W) delay based on a time difference between the first write operation and a second write operation on a memory unit in the group of memory units, such that the second write operation occurred prior to the first write operation. The W2W delay can represent an amount of time that has elapsed since the most recent write to any memory unit in the group of memory units. The W2W delay can be determined as a difference between a time at which the write operation is performed (e.g., a current time) and a write timestamp that represents a time at which the most recent write operation was performed on any memory unit in the group of memory units. The write timestamp can be stored in metadata of the memory sub-system and associated with the group of memory units. Each time a write operation is performed on a memory unit of the group, the memory sub-system can update the write timestamp to reflect the time at which the write operation is performed (e.g., a current time).

At operation 406, the processing device identifies a threshold time criterion that is satisfied by the W2W delay. The processing device can identify the reference tag using a data structure in which each record includes a threshold time criterion. Each threshold time criterion can be a condition that, when evaluated for a specified W2W delay, produces a result of true (if the condition is satisfied) or false (if the condition is not satisfied). The processing device can search the data structure for a record having a threshold time criterion that is satisfied by the W2W delay. If the data structure contains a matching record (e.g., a record having a threshold criterion that is satisfied by the W2W delay), then the threshold time criterion is or corresponds to the threshold criterion satisfied by the W2W delay.

At operation 408, the processing device identifies a first read voltage level associated with the threshold time criterion satisfied by the W2W delay. If the data structure searched at operation 406 contains a matching record (e.g., a record having a threshold criterion that is satisfied by the W2W delay), then the identified first read level is specified by the reference tag included in the matching record. An example data structure that include entries mapping threshold criteria to read voltage levels is shown in FIG. 5C.

Multiple thresholds can be used, in which case the read voltage level can be selected from more than two read voltage levels. For example, the read voltage level can be set to a first read voltage level if the write-to-write time is less than a first threshold amount of time, to a second (e.g., higher) read voltage level if the write-to-write time is between the first threshold amount of time and a second threshold amount of time, and to a third (e.g., yet higher) read voltage level if the write-to-write time is greater than or equal to the second threshold amount of time.

At operation 410, the processing device identifies a second memory unit of the group of memory units, wherein the second memory unit is associated with a second read voltage level that satisfies a selection criterion, and wherein the selection criterion is based on a comparison of the second read voltage level to the first read voltage level. The selection criterion can be satisfied if, for example, the second read voltage level tag is less than the reference tag. Operation 410 can identify each of the second memory units of the group of memory nits except for the first memory unit (on which the write operation was performed at operation 402). Since the first memory unit was written at operation 402, the read voltage level associated with the first memory unit can be reset to the initial (e.g., base) read voltage level.

At operation 412, the processing device associates the first read voltage level with the second memory unit. The processing device can, for example, store a record in a data structure that maps memory unit identifiers to read voltage levels. The record can associate a memory unit identifier of the second memory unit with the first read voltage level. The record can replace an existing record that associates the memory unit identifier with a different read voltage levels (such as a previously-associated read voltage level). The associated read voltage level can be used in read operations as described below with respect to FIGS. 4C and 4D.

Figure 4B:
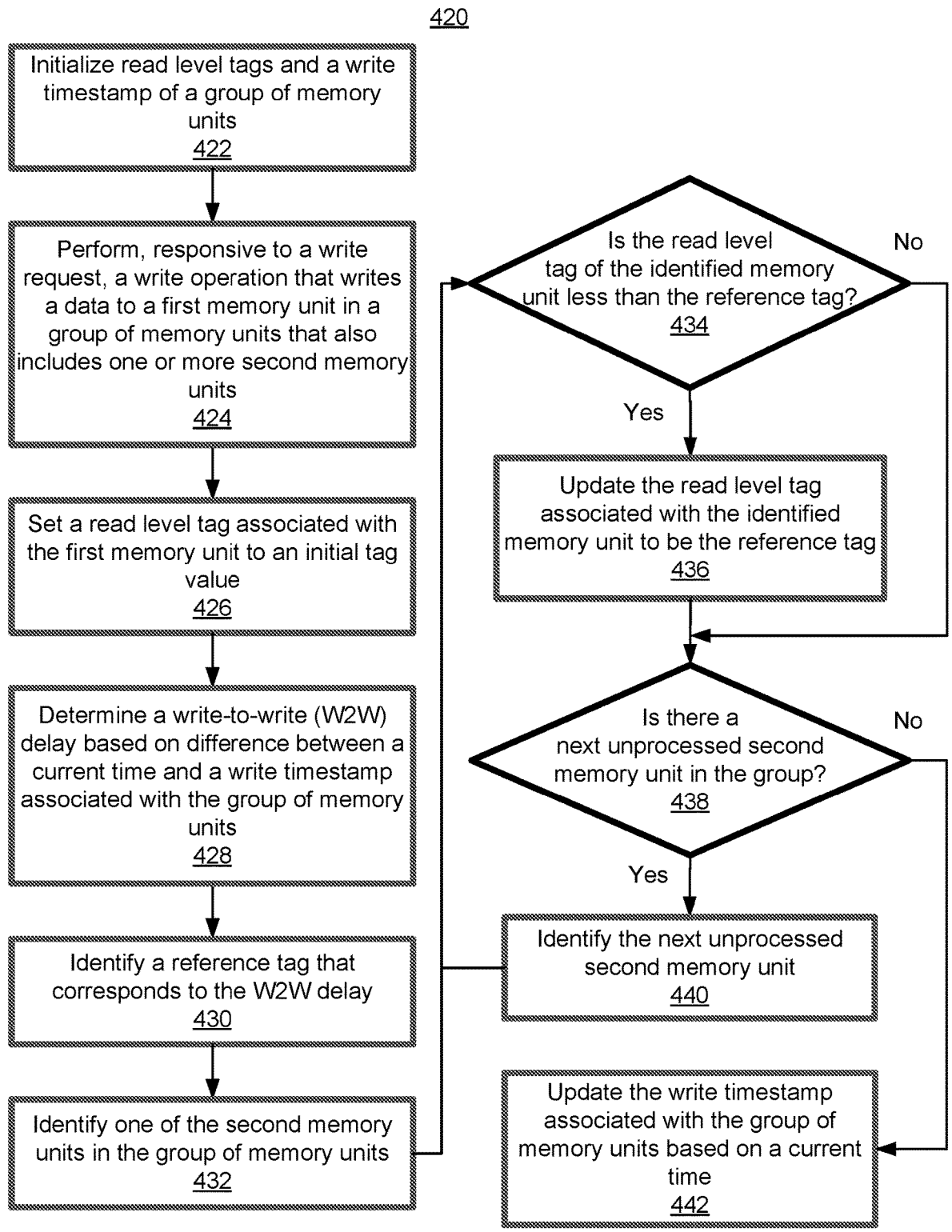
FIG. 4B is a flow diagram of an example method to associate read level tags with memory units based on W2W delay in accordance with some embodiments.

FIG. 4B is a flow diagram of an example method 420 to associate read level tags with memory units and update a write timestamp in accordance with some embodiments. The method 420 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 420 is performed by the read level management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. Although the description of method 420 refers to read level tags that can be mapped to read voltage levels, method 420 can alternatively be used to associate read voltage levels with memory units. The read voltage levels can be read level identifiers (e.g., represented using a small number of bits) or voltage values (e.g., 0.2 volts).

At operation 422, the processing device initializes read level tags and a write timestamp of a group of memory units. The processing device can execute operation 422 in response to, for example, a format operation or a group-level write operation that applies to each memory unit in the group. Each memory unit can be associated with a read level tag, and each read level tag can be set to an initial tag value when the memory unit has been recently written to, so that the amount of voltage drift is low. The initial tag value can be a read level tag 0 can represent a lowest read voltage, e.g., a base read level of a memory device 130.

At operation 424, the processing device performs, responsive to a write request, a write operation that writes specified data to a first memory unit in a group of memory units that also includes one or more second memory units. At operation 426, the processing device sets a read level tag associated with the first memory unit to an initial tag value. The initial tag value can correspond to a base read level, since the voltage drift of the memory cells of the memory unit is ordinarily reduced by the write operation performed at operation 424.

At operation 428, the processing device determines a write-to-write (W2W) delay based on difference between a current time and a write timestamp associated with the group of memory units. The W2W delay can represent an amount of time that has passed between a first write operation performed on a memory unit in a group of memory units and a second write operation that is the most recent write prior to the first write on operation performed on any memory unit in the group of memory units.

The W2W delay for a memory unit can be determined for a particular write operation based on a difference between the time at which the write operation is performed and a write timestamp associated with the group of memory units that contains the memory unit. The write timestamp indicates the time at which the most recent previous write operation was performed on the group of memory units. The write timestamp can be stored in metadata, for example. The write timestamp can initially be a time at which a drive format operation or other write operation that affects all memory units in the group of memory units (e.g., a group-level write operation) is performed, for example. The write timestamp associated with a group of memory units can be updated each time a write operation is performed on any memory unit in the group.

At operation 430, the processing device identifies a reference tag that corresponds to the W2W delay. The processing device can identify the reference tag using a data structure in which each record includes a threshold time criterion and a reference tag. Each threshold time criterion can be a condition that, when evaluated for a specified delay time, produces a result of true (if the condition is satisfied) or false (if the condition is not satisfied). The condition can include one or more threshold values. For example, if the specified delay time is greater than a threshold value, then the condition is satisfied. As another example, if the specified delay time is between two threshold values, then the condition is satisfied. The processing device can search the data structure for a record having a threshold time criterion that is satisfied by the W2W delay time determined at operation 428. If the data structure contains a matching record (e.g., a record having a threshold criterion that is satisfied by the W2W delay), then the identified reference tag is specified by the reference tag include in the matching record. Example data structures that include entries mapping threshold criteria to reference tags are shown in FIGS. 5A and 5C.

At operation 432, the processing device identifies one of the second memory units in the group of memory units. Operation 432 can iterate through the memory units of a group of memory units, e.g., by selecting a different memory unit each time operation 432 is performed by method 420. Thus, operation 432 causes the subsequent operation (434) to be performed for each memory unit in the group of memory units. For each of the second memory units in the group, the method 420 can set the associated existing read level tag to a reference tag that corresponds to the write-to-write (W2W) delay if the reference tag satisfies a threshold criterion. In one example, the selection criterion is satisfied if the existing read level tag is less than the reference tag, so that existing read level tags greater than or equal to the reference tag are not updated. Thus, relatively short W2W delays, which are mapped to lower-valued read level tags, do not cause the read level management component 113 to change higher-valued read level tags (which correspond to larger amounts of voltage shift) to lower-valued read level tags.

At operation 434, the processing device determines whether the read level tag of the identified memory unit is less than the reference tag. If so, at operation 436, the processing device updates the read level tag associated with the identified memory unit to be the reference tag. The processing device can, for example, store a record in a data structure that maps memory unit identifiers to read level tags. The record can that associate a memory unit identifier of the one of the second memory units with the reference tag. The record can replace an existing record that associates the memory unit identifier with a different tag (such as the selected read level tag). If at operation 422 the processing device determines that the read level tag of the identified memory unit is not less than the reference tag, then the processing device continues operations at operation 438.

At operation 438, the processing device determines whether there is a next unprocessed second memory unit in the group. If so, at operation 440, the processing device identifies the next unprocessed second memory unit, and continues operations at operation 434. The next unprocessed second memory unit can be a memory unit in the group of memory units that has not previously been identified by operation 432 or 440. If at operation 438 the processing device determines that there are no further unprocessed second memory units in the group, then the processing device continues operations at operation 442. At operation 442, the processing device updates the write timestamp associated with the group of memory units to reflect a time at which the write operation of operation 424 was performed, e.g., based on a current time.

FIG. 4C is a flow diagram of an example method 450 to read data from a memory unit using a read voltage level associated with the memory unit in accordance with some embodiments. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the read level management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452, the processing device receives a request to read from a memory unit. At operation 454, the processing device, responsive to the request to read from the memory unit, identifies a read voltage level associated with the memory unit. The processing device can use a data structure that maps memory units to read voltage levels to identify the read voltage level. Examples of such data structures are shown in FIG. 6. The data structure can be generated by, for example, operation 412 of FIG. 4A or operation 436 of FIG. 4B. The processing device can search the data structure for a record that includes a memory unit identifier corresponding to the memory unit from which data is to be read. If a matching record that includes the memory unit identifier is found, then the identified read voltage level voltage is specified by the read voltage level in the matching record. At operation 456, the processing device reads data from the memory unit in accordance with the identified read voltage level.

FIG. 4D is a flow diagram of an example method 460 to read data from a memory unit using a read level tag in accordance with some embodiments. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the read level management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 462, the processing device receives a request to read from a memory unit. At operation 464, the processing device, responsive to the request to read from the memory unit, identifies a read level tag associated with the memory unit. The processing device can use a data structure that maps memory units to read level tags to identify the read level tag. Examples of such data structures are shown in FIG. 6. The data structure can be generated by, for example, operation 412 of FIG. 4A or operation 436 of FIG. 4B. The processing device can search the data structure for a record that includes a memory unit identifier corresponding to the memory unit from which data is to be read. If a matching record that includes the memory unit identifier is found, then the associated read level tag is specified by the matching record.

At operation 466, the processing device identifies a read voltage level that corresponds to the read level tag. The processing device can use a data structure that maps read level tags to read voltage levels to identify the read voltage level. An example of such data a data structure is shown in FIG. 5B. The processing device can search the data structure for a record that includes the read level tag identified by operation 464. If a matching record that includes the read level tag is found, then the associated read voltage level is specified by the matching record. At operation 468, the processing device reads data from the memory unit in accordance with the identified read voltage level.

FIG. 5A illustrates a table 500 that maps threshold time criteria 506 to read level tags 508 in accordance with some embodiments. The table 520 can be used by the read level management component 510 to identify reference read level tags 508 that correspond to threshold time criteria 506. The table 500 includes four records 501-504, each of which maps a threshold time criterion 506 to a read level tag 508. The threshold time criteria 506 and read level tags 508 can be determined by media characterization information, for example.

The first record 501 includes a threshold time criterion 506, which is "W2W>=0 seconds and <1 minute," and a read level tag 508, which is 0. Accordingly, the first record 521 specifies that W2W delay times between 0 seconds and 1 minute are mapped to a read level tag having the value 0. The threshold time criterion 506 of the first record 521 thus includes a lower delay threshold of 0 seconds and an upper delay threshold of 1 minute. For example, if the W2W delay is 20 seconds, then the selected reference read level tag has the value 0 because the W2W delay of 20 seconds satisfies the threshold time "criterion W2W>=0 seconds and <1 minute" associated with the read level tag 0 by record 501.

The second record 502 includes a threshold time criterion 506, which is "W2W>=1 minute and <60 minutes," and a read level tag 508, which is 1. Accordingly, the second record 522 specifies that W2W delay times between 1 minute and 60 minutes are mapped to a read level tag having the value 1. The threshold time criterion 506 of the second record 522 thus includes a lower delay threshold of 1 minute and an upper delay threshold of 60 minutes. The third record 503 includes a threshold time criterion 506, which is "W2W>=60 minutes and <180 minutes," and a read level tag 508, which is 2. Accordingly, the third record 523 specifies that W2W delay times between 60 minutes and 180 minutes are mapped to a read level tag having the value 2. The fourth record 504 includes a threshold time criterion 506, which is "W2W>=180 minutes, and a read level tag 508, which is 3. Accordingly, the fourth record 524 specifies that W2W delay times of 180 minutes or more are mapped to a read level tag having the value 3.

FIG. 5B illustrates a table 505 that maps read level tags 508 to read voltage levels 510 in accordance with some embodiments. The table 505 can be used by the read level management component 113 to identify read voltage levels 510 that correspond to threshold time criteria 506. The table 505 includes four records 511-514, each of which maps a read level tag 508 to a read voltage level 510. The read level tags 508 and read voltage levels 510 can be determined by media characterization information, for example.

The first record 511 includes a read level tag 508 (0) and a read voltage level 510 (VDM1). Accordingly, the first record 521 specifies that a read level tag having the value 0 is mapped to a read voltage demarcation level ("VDM") 1 (e.g., a numeric value 1 or a numeric value 0.1 volts). The second record 512 specifies that a read level tag having the value 1 is mapped to a read voltage level VDM 2 (e.g., a numeric value 2 or a numeric value 0.15 volts). The third record 513 specifies that a read level tag having the value 2 is mapped to a read voltage level VDM 3 (e.g., a numeric value 3 or a numeric value 0.2 volts). The fourth record 514 specifies that a read level tag having the value 3 is mapped to a read voltage level VDM 4 (e.g., a numeric value 4, or a numeric value 0.25 volts).

FIG. 5C illustrates a table 520 that maps threshold time criteria 506 to read voltage levels 510 in accordance with some embodiments. The table 520 can be used by the read level management component 113 as an alternative to or in addition to tables 500 and 505 to identify read voltage levels 510 that correspond to threshold time criteria 506. The table 520 includes four records 521-524, each of which maps a threshold time criterion 506 to a read voltage level 510. The threshold time criteria 506 and read voltage levels 510 can be determined by media characterization information, for example.

The first record 521 includes a threshold time criterion 506 ("W2W>=0 seconds and <1 minute") and a read voltage level 510 (1). Accordingly, the first record 521 specifies that W2W delay times between 0 seconds and 1 minute are mapped to a read voltage level 1. For example, if the W2W delay is 20 seconds, then the selected read voltage level is 1 because the W2W delay of 20 seconds satisfies the threshold time "criterion W2W>=0 seconds and <1 minute" associated with the read voltage level 1 by record 521.

The second record 522 includes a threshold time criterion 506 ("W2W>=1 minute and <60 minutes") and a read voltage level 510 (2). Accordingly, the second record 522 specifies that W2W delay times between 1 minute and 60 minutes are mapped to a read voltage level 2. The third record 523 includes a threshold time criterion 506 ("W2W>=60 minutes and <180 minutes) and a read voltage level 510 (3). Accordingly, the third record 523 specifies that W2W delay times between 60 minutes and 180 minutes are mapped to a read voltage level 3. The fourth record 524 includes a threshold time criterion 506 ("W2W>=180 minutes") and a read voltage level 510 (4). Accordingly, the fourth record 524 specifies that W2W delay times of 180 minutes or more are mapped to a read voltage level 3. Although particular threshold time criteria, read level tags, and read voltage levels are shown in the examples of FIGS. 5A-5C, other threshold time criteria, read level tags, and read voltage levels can be used in other examples.

FIG. 6 illustrates example tables 600-610, each of which maps memory unit identifiers to read voltage levels at a corresponding time in accordance with some embodiments. Each of the tables 600-610 can represent a mapping between memory units 304 of a group of memory units and corresponding read voltage levels or, alternatively, read level tags 310 shown in FIG. 3. Each of the tables 600-610 shows the results of operations performed by read level management component 113 that update the read voltage levels (or, alternatively, read level tags) in response to a write operation. The write operation associated with each table that occurs at the time shown above the table. Although the description below regarding the example tables of FIG. 6 refers to read voltage levels, the description also applies to tables having read voltage tags instead of or in addition to read level voltages.

Table 600 shows the read voltage levels associated with memory unit identifiers at an initial time T=0 minutes, e.g., prior to any write operations being performed on a group of memory units after a format operation. The group of memory units includes memory units MU0-MU4. Each memory unit is associated with read voltage level. At an initial time T=0, no write operations have been performed on the group of memory units. As shown by table 600, at time T=0, each read voltage level has an initial value, such as 0. Further, at time T=0, the write timestamp associated with the group of memory units has the value 0, and the W2W delay has an initial value of 0.

Table 602 shows the read voltage levels of memory units subsequent to a write operation performed on memory unit MU2. The write operation is performed at time T=2 minutes. At time T=2 minutes, the write timestamp is 0, and the W2W delay is 2 minutes (calculated as the time of the write operation (2 minutes) minus the write timestamp (0 minutes). The read level management component 113 can identify a first memory unit, which is the memory unit to which data was written by the write operation that occurred at T=2 minutes (MU2 in this example), and one or more second memory units, which are the other memory units in the group, to which data was not written by the write operation that occurred at T=2 minutes (MU0, MU1, MU3, and MU4). Since data was written to MU2, the read level management component 113 sets the read voltage level associated with MU2 to 0. For the other memory units in the group, the read level management component 113 identifies a reference read voltage level using table 500 of FIG. 5A (or, alternatively, table 520 of FIG. 5C), Since the W2W delay is 2 minutes, the threshold time criterion of record 502 is satisfied, and the reference read voltage level is 1 according to table 500.

The read level management component 113 updates one or more selected read voltage levels that satisfy a selection criterion. In this example, the selection criterion is satisfied if the selected read voltage level is less than the read voltage level, so that read voltage levels greater than or equal to the reference read voltage level are not updated. Thus, relatively short W2W delays, which are mapped to lower read voltage levels, do not cause the read level management component 113 to change higher read voltage levels, which correspond to larger amounts of voltage shift, to lower read voltage levels.

For table 602, to identify the selected read voltage level(s), the read level management component 113 evaluates the selection criterion based on the value of each of the second read voltage levels. Prior to the write operation that occurs at T=2 minutes, the value of each of the second read voltage levels is 0 (as shown by the previous table, which is table 600). Since each of the selected read voltage levels is 0, which is less than the reference read voltage level of 1, each of the second read voltage levels satisfies the selection criterion, and each is selected to be updated. The read level management component 113 updates each of the selected read voltage levels by setting each one to the reference read voltage level (1). Thus, as shown in table 602, as a result of the write operation that occurs at T=2 minutes, the read level management component 113 has generated read voltage levels 1, 1, 0, 1, 1 for MU0, MU1, MU2, MU3, MU4, respectively.

Table 604 shows the read voltage levels of memory units subsequent to a write operation performed on memory unit MU1. The write operation is performed on MU1 at time T=65 minutes. At time T=65 minutes, the write timestamp is 2 minutes (which is the time at which the previous write operation occurred), and the W2W delay is 63 minutes (calculated as the time of the write operation (65 minutes) minus the write timestamp (2 minutes). The read level management component 113 can identify a first memory unit, which is the memory unit to which data was written by the write operation that occurred at T=65 minutes (MU1 in this example), and one or more second memory units, which are the other memory units in the group, to which data was not written by the write operation that occurred at T=65 minutes (MU0, MU2, MU3, and MU4). Since data was written to MU1, the read level management component 113 sets the read voltage level associated with MU1 to 0. For the other memory units in the group, the read level management component 113 identifies a reference read voltage level using table 500 of FIG. 5A, Since the W2W delay is 63 minutes, the threshold time criterion of record 503 is satisfied, and the reference read voltage level is 2 according to table 500.

According to the selection criterion described above, the read level management component 113 updates each selected read voltage level that is less than the reference read voltage level. The values of the read voltage levels prior to the write that occurs at time T=65 are shown by the previous table, which is table 602. Thus, the values of the read voltage levels of the second memory units prior to the write operation that occurs at T=65 for MU0, MU2, MU3, and MU4 are 1, 1, 1, 1, respectively. Since each of the second read voltage levels is 1, which is less than the reference read voltage level of 2, each of the second read voltage levels satisfies the selection criterion. Thus, each of the second read voltage levels is selected to be updated. The read level management component 113 updates each of the selected read voltage levels by setting each one to the reference read voltage level (2). As shown in table 604, as a result of the write operation that occurs at T=65 minutes, the read level management component 113 has generated read voltage levels 2, 0, 2, 2, 2 for MU0, MU1, MU2, MU3, MU4, respectively.

Table 606 shows the read voltage levels of memory units subsequent to a write operation performed on memory unit MU2. The write operation is performed on MU2 at time T=68 minutes. At time T=68 minutes, the write timestamp is 65 minutes (which is the time at which the previous write operation occurred), and the W2W delay is 3 minutes (calculated as the time of the write operation (68 minutes) minus the write timestamp (65 minutes). The read level management component 113 can identify a first memory unit, which is the memory unit to which data was written by the write operation that occurred at T=68 minutes (MU2 in this example), and one or more second memory units, which are the other memory units in the group, to which data was not written by the write operation that occurred at T=68 minutes (MU0, MU1, MU3, and MU4). Since data was written to MU2, the read level management component 113 sets the read voltage level associated with MU2 to 0. For the other memory units in the group, the read level management component 113 identifies a reference read voltage level using table 500 of FIG. 5A, Since the W2W delay is 3 minutes, the threshold time criterion of record 502 is satisfied, and the reference read voltage level is 1 according to table 500.

According to the selection criterion described above, the read level management component 113 updates each selected read voltage level that is less than the reference read voltage level. The values of the read voltage levels prior to the write that occurs at time T=68 are shown by the previous table, which is table 604. In this example, the values of the read voltage levels of the second memory units prior to the write operation that occurs at T=68 for MU0, MU1, MU3, and MU4 are 2, 0, 2, 2, respectively. The selection criterion is satisfied by read voltage levels that are less than the reference read voltage level of 1. The only read voltage level less than 1 is the read voltage level associated with MU1. The read level management component 113 updates the read voltage level associated with MU1 by setting the read voltage level associated with MU1 to the reference read voltage level (1). Thus, as shown in table 606, as a result of the write operation that occurs at T=68 minutes, the read level management component 113 has generated read voltage levels 2, 1, 0, 2, 2 for MU0, MU1, MU2, MU3, MU4, respectively.

Table 608 shows the read voltage levels of memory units subsequent to a write operation performed on memory unit MU3. The write operation is performed on MU3 at time T=268 minutes. At time T=268 minutes, the write timestamp is 68 minutes (which is the time at which the previous write operation occurred), and the W2W delay is 200 minutes (calculated as the time of the write operation (268 minutes) minus the write timestamp (268 minutes). The read level management component 113 can identify a first memory unit, which is the memory unit to which data was written by the write operation that occurred at T=268 minutes (MU3 in this example), and one or more second memory units, which are the other memory units in the group, to which data was not written by the write operation that occurred at T=268 minutes (MU0, MU1, MU2, and MU4). Since data was written to MU3, the read level management component 113 sets the read voltage level associated with MU3 to 0. For the other memory units in the group, the read level management component 113 identifies a reference read voltage level using table 500 of FIG. 5A, Since the W2W delay is 200 minutes, the threshold time criterion of record 504 is satisfied, and the reference read voltage level is 3 according to table 500.

According to the selection criterion described above, the read level management component 113 updates each selected read voltage level that is less than the reference read voltage level. The values of the read voltage levels prior to the write that occurs at time T=268 are shown by the previous table, which is table 606. Thus, the values of the read voltage levels of the second memory units prior to the write operation that occurs at T=268 for MU0, MU1, MU2, and MU4 are 2, 1, 0, 2, respectively. Since each of the second read voltage levels is less than the reference read voltage level of 3, each of the second read voltage levels satisfies the selection criterion. Thus, each of the second read voltage levels is selected to be updated. The read level management component 113 updates each of the selected read voltage levels by setting each one to the reference read voltage level (3). As shown in table 608, as a result of the write operation that occurs at T=268 minutes, the read level management component 113 has set the read voltage levels to 3, 3, 3, 0, 3 for MU0, MU1, MU2, MU3, MU4, respectively.

Table 610 shows the read voltage levels of memory units subsequent to a write operation performed on memory unit MU4. The write operation is performed on MU4 at time T=338 minutes. At time T=338 minutes, the write timestamp is 268 minutes (which is the time at which the previous write operation occurred), and the W2W delay is 70 minutes (calculated as the time of the write operation (338 minutes) minus the write timestamp (268 minutes). The read level management component 113 can identify a first memory unit, which is the memory unit to which data was written by the write operation that occurred at T=338 minutes (MU4 in this example), and one or more second memory units, which are the other memory units in the group, to which data was not written by the write operation that occurred at T=338 minutes (MU0, MU1, MU2, and MU3). Since data was written to MU4, the read level management component 113 sets the read voltage level associated with MU4 to 0. For the other memory units in the group, the read level management component 113 identifies a reference read voltage level using table 500 of FIG. 5A, Since the W2W delay is 80 minutes, the threshold time criterion of record 503 is satisfied, and the reference read voltage level is 2 according to table 500.

According to the selection criterion described above, the read level management component 113 updates each selected read voltage level that is less than the reference read voltage level. The values of the read voltage levels prior to the write that occurs at time T=338 are shown by the previous table, which is table 608. In this example, the values of the read voltage levels of the second memory units prior to the write operation that occurs at T=338 for MU0, MU1, MU2, and MU3 are 3, 3, 3, 0, respectively. The selection criterion is satisfied by read voltage levels that are less than the reference read voltage level of 2. The only read voltage level less than 2 is the read voltage level associated with MU3 (having read voltage level 0). The read level management component 113 updates the read voltage level associated with MU3 by setting the read voltage level associated with MU3 to the reference read voltage level (2). Thus, as shown in table 610, as a result of the write operation that occurs at T=33 minutes, the read level management component 113 has generated read voltage levels 3, 3, 3, 2, 0 for MU0, MU1, MU2, MU3, MU4, respectively.

Figure 7:
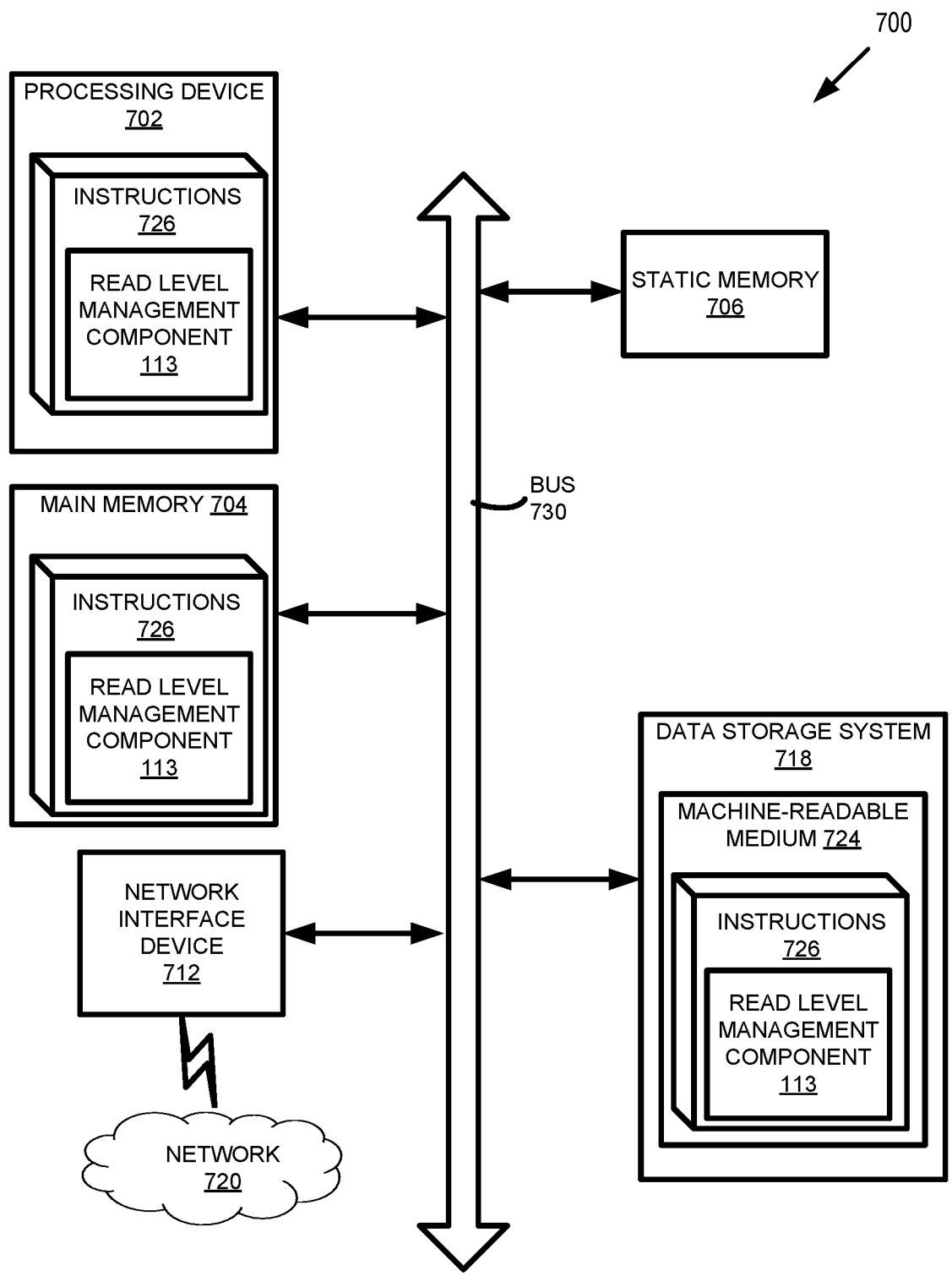
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a read level management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a read voltage adjustment component (e.g., the read level management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a group of memory units; and
a processing device, operatively coupled to the memory device, to perform operations comprising:
performing a first write operation that writes data to a first memory unit of the group of memory units;
determining a write-to-write (W2W) delay based on a time difference between the first write operation and a second write operation on a memory unit in the group of memory units, wherein the second write operation occurred prior to the first write operation;
identifying a threshold time criterion that is satisfied by the W2W delay;
identifying a first read voltage level associated with the threshold time criterion; and
associating the first read voltage level with a second memory unit of the group of memory units.

2. The system of claim 1, the operations further comprising:
identifying the second memory unit, wherein the second memory unit is associated with a second read voltage level that satisfies a selection criterion, and wherein the selection criterion is based on a comparison of the second read voltage level to the first read voltage level.

3. The system of claim 2, wherein the second read voltage level satisfies the selection criterion if the second read voltage level is less than the first read voltage level.

4. The system of claim 1, the operations further comprising:
responsive to performing the first write operation, associating a base read level of the memory device with the first memory unit.

5. The system of claim 1, wherein the threshold time criterion is identified using a data structure that comprises a plurality of records, each record mapping a respective threshold time criterion to a corresponding read voltage level.

6. The system of claim 5, wherein identifying the threshold time criterion that is satisfied by the W2W delay comprises:
identifying, in the data structure, a record comprising a particular threshold time criterion that is satisfied by the W2W delay, wherein the identified threshold time criterion is based on the particular threshold time criterion.

7. The system of claim 6, wherein identifying, in the data structure, the record that comprises the particular threshold time criterion that is satisfied by the W2W delay comprises:
comparing the W2W delay to a threshold value associated with the particular threshold time criterion.

8. The system of claim 1, wherein the operations further comprise:
   receiving a request to read from a specified memory unit;
   responsive to the request to read from the specified memory unit, identifying a read voltage level associated with the specified memory unit; and
   reading data from the specified memory unit in accordance with the read voltage level.

9. The system of claim 8, wherein the read voltage level associated with the specified memory unit is identified using a data structure that comprises a plurality of records, each record mapping a memory unit to a corresponding read voltage level.

10. The system of claim 9, wherein identifying the read voltage level associated with the specified memory unit comprises:
   identifying, in the data structure, a record comprising a particular memory unit identifier that corresponds to the specified memory unit, wherein the record maps the particular memory unit identifier to a particular read voltage level, and the identified read voltage level is based on the particular read voltage level.

11. The system of claim 1, wherein the W2W delay is determined based on the time difference between a first time at which the first write operation is performed and a second time at which the second write operation was performed on the memory unit of the group of memory units.

12. The system of claim 11, wherein the time at which the second write operation was performed is specified by a write timestamp associated with the group of memory units, and wherein the write timestamp is stored in metadata of a memory sub-system that includes the memory device.

13. The system of claim 12, wherein the operations further comprise:
   responsive to performing the first write operation, updating the write timestamp based on a current time.

14. The system of claim 1, wherein associating the first read voltage level with the second memory unit comprises:
   storing, in a data structure that comprises a plurality of records, each record mapping a memory unit to a corresponding read voltage level, a record that maps the second memory unit to the first read voltage level.

15. The system of claim 1, wherein associating the first read voltage level with the second memory unit replaces an existing association between the second memory unit and a second read voltage level.

16. A method comprising:
   performing, by a processing device, a first write operation that writes a data to a first memory unit of a group of memory units;
   determining a write-to-write (W2W) time based on the first write operation and a second write operation that occurred prior to the first write operation;
   identifying, in a data structure, a threshold time criterion that is satisfied by the W2W delay, wherein the data structure comprises an association between the threshold time criterion and a first read voltage level;
   identifying a second read voltage level associated with a second memory unit of the group of memory units; and
   responsive to determining that the second read voltage level is less than the first read voltage level, setting the second read voltage level associated with the second memory unit to a value of the first read voltage level.

17. The method of claim 16, further comprising:
   receiving a request to read from a specified memory unit;
   responsive to the request to read from the specified memory unit, identifying a read voltage level associated with the specified memory unit; and
   reading data from the specified memory unit in accordance with the read voltage level.

18. The method of claim 16, further comprising: responsive to performing the first write operation, associating a base read level of a memory device with the first memory unit.

19. A non-transitory computer readable medium comprising instructions, which when executed by a processing device, cause the processing device to perform operations comprising:
   performing a first write operation that writes a data to a first memory unit of a group of memory units;
   determining a write-to-write (W2W) time based on the first write operation and a second write operation that occurred prior to the first write operation;
   identifying, in a data structure, a threshold time criterion that is satisfied by the W2W delay, wherein the data structure comprises an association between the threshold time criterion and a first read voltage level;
   identifying a second read voltage level associated with a second memory unit of the group of memory units; and
   responsive to determining that the second read voltage level is less than the first read voltage level, setting the second read voltage level associated with the second memory unit to a value of the first read voltage level.

20. The non-transitory computer readable medium of claim 19, the operations further comprising:
   receiving a request to read from a specified memory unit;
   responsive to the request to read from the specified memory unit, identifying a read voltage level associated with the specified memory unit; and
   reading data from the specified memory unit in accordance with the read voltage level.

* * * * *